United States Patent
Yamagami

(10) Patent No.: US 11,022,572 B2
(45) Date of Patent: Jun. 1, 2021

(54) SUBSTRATE CONTAMINATION ANALYSIS SYSTEM

(71) Applicant: Rigaku Corporation, Akishima (JP)

(72) Inventor: Motoyuki Yamagami, Ibaraki (JP)

(73) Assignee: RIGAKU CORPORATION, Tokyo (JP)

( * ) Notice: Subject to any disclaimer, the term of this patent is extended or adjusted under 35 U.S.C. 154(b) by 0 days.

(21) Appl. No.: 16/643,596

(22) PCT Filed: Jul. 3, 2018

(86) PCT No.: PCT/JP2018/025256
§ 371 (c)(1),
(2) Date: Mar. 2, 2020

(87) PCT Pub. No.: WO2019/058706
PCT Pub. Date: Mar. 28, 2019

(65) Prior Publication Data
US 2020/0386697 A1    Dec. 10, 2020

(30) Foreign Application Priority Data

Sep. 20, 2017  (JP) .............................. JP2017-179706

(51) Int. Cl.
  G01N 23/2204    (2018.01)
  G01N 23/2202    (2018.01)
  G01N 23/223     (2006.01)

(52) U.S. Cl.
  CPC ..... G01N 23/2204 (2013.01); G01N 23/2202 (2013.01); G01N 23/223 (2013.01)

(58) Field of Classification Search
  None
  See application file for complete search history.

(56) References Cited

U.S. PATENT DOCUMENTS

2003/0043963 A1 * 3/2003 Yamagami ........... G01N 23/223
                                                          378/44
2008/0121027 A1   5/2008 Hason et al.
(Continued)

FOREIGN PATENT DOCUMENTS

JP    H08-86724 A     4/1996
JP    2003-075374 A   3/2003
(Continued)

OTHER PUBLICATIONS

English translation for the International Search Report for PCT/JP2018/025256 dated Sep. 18, 2018.
(Continued)

Primary Examiner — Hoon K Song
(74) Attorney, Agent, or Firm — HEA Law PLLC

(57) ABSTRACT

Provided is a substrate contamination analysis system capable of individually analyzing impurities present in a film and impurities present on a surface of the film. The substrate contamination analysis system includes: a vapor phase decomposition device configured to expose a film formed on a surface of a first substrate to a gas that reacts with the film, to thereby dissolve the film; a recovery device configured to perform a first recovery operation of moving an object to be measured to a first measurement position before the film is dissolved and a second recovery operation of moving the object to be measured to a second measurement position after the film is dissolved; and an analyzer configured to analyze the object to be measured every time the recovery device performs the first recovery operation and the second recovery operation.

9 Claims, 13 Drawing Sheets

(56) References Cited

U.S. PATENT DOCUMENTS

2017/0072378 A1    3/2017   Wu et al.
2018/0088100 A1*   3/2018   Yamada ................... G01N 1/38
2019/0013248 A1    1/2019   Kawabata et al.

FOREIGN PATENT DOCUMENTS

JP      2012-009475 A    1/2012
JP      2017-053806 A    3/2017
WO      2017/149833 A1   9/2017

OTHER PUBLICATIONS

Office Action of Feb. 12, 2019, for corresponding JP application No. 2017-179706.

* cited by examiner (a)

(b)

(a)

(b)

(a)

(b)

(a)

(b)

(a)

(b)

(a)

(b)

(a)

(b)

(a)

(b)

SUBSTRATE CONTAMINATION ANALYSIS SYSTEM

CROSS REFERENCE TO RELATED APPLICATIONS

This application is a National Stage of International Application No. PCT/JP2018/025256 filed on Jul. 3, 2018, which claims priority from Japanese Patent Application 2017-179706, filed on Sep. 20, 2017. The contents of the above documents are incorporated herein by reference in their entirety.

TECHNICAL FIELD

The present invention relates to a substrate contamination analysis system.

BACKGROUND ART

When contaminants contained in a substrate such as a semiconductor substrate are analyzed, there may be a case where the amounts of the contaminants to be measured are extremely small, and it is difficult to analyze the contaminants. As a method to be used in such case, there has been known a vapor phase decomposition (VPD) method for recovering contaminants with a liquid droplet to collect the contaminants to one location. In addition, as the method of recovering the contaminants by the VPD method and analyzing the contaminants, there are given an inductively coupled plasma mass spectrometry (ICP-MS) instrument and an atomic absorption spectrometry (AAS) instrument configured to analyze the contaminants in a liquid state, and a total reflection X-ray fluorescence (TXRF) spectrometer configured to dry a recovered liquid and analyze the resultant.

For example, there have been known a sample pretreatment device configured to dissolve an object to be measured, which is present on a surface of a substrate, dry the object to be measured, and hold the resultant on the surface of the substrate, and an X-ray fluorescence analysis system including, for example, an X-ray fluorescence spectrometer (see Patent Literature 1).

In addition, as a device configured to recover contaminants with a liquid droplet to collect the contaminants to one location, there has been known a substrate processing device including a jig configured to jet a gas from a circular opening (see Patent Literature 2). In Patent Literature 2, it is disclosed that the jig is held so as to surround the liquid droplets adhering to a surface of a substrate with the opening, and moving the jig along the surface of the substrate while spraying a gas jetted from the opening to the surface of the substrate.

CITATION LIST

Patent Literature

[PTL 1] JP 2003-75374 A
[PTL 2] JP 2012-9475 A

SUMMARY OF INVENTION

Technical Problem

The substrate is not limited to one made of a single material, and there exists a substrate having a film formed on a surface. For example, as a Si substrate used for manufacturing a semiconductor product, there are given not only a product made of a Si single substance but also a product, in which a film of $SiO_2$ is formed on a surface, obtained by oxidizing the surface of a Si substrate.

In this case, there are impurities mixed in the film in the process of forming the film of $SiO_2$ or the like on the surface, and impurities adhering to the surface of the film after the film is formed. In order to reduce the impurities to be mixed, it is required to individually know the impurities present in the film and the impurities present on the surface of the film.

However, in the X-ray fluorescence analysis system as disclosed in Patent Literature 1, and an X-ray fluorescence analysis system obtained by combining the substrate processing device as disclosed in Patent Literature 2 with the X-ray fluorescence analysis system as disclosed in Patent Literature 1, the impurities present in the film and the impurities present on the surface of the film cannot be individually analyzed.

The present invention has been made in view of the above-mentioned problem, and an object of the present invention is to provide a substrate contamination analysis system capable of individually analyzing impurities present in a film and impurities present on a surface of the film.

Solution to Problem

An embodiment of a substrate contamination analysis system includes: a vapor phase decomposition device configured to expose a film formed on a surface of a first substrate to a gas that reacts with the film, to thereby dissolve the film; a recovery device configured to perform a first recovery operation of moving an object to be measured to a first measurement position before the film is dissolved and a second recovery operation of moving the object to be measured to a second measurement position after the film is dissolved; and an analyzer configured to analyze the object to be measured every time the recovery device performs the first recovery operation and the second recovery operation.

According to an embodiment of a substrate contamination analysis system, in the substrate contamination analysis system above, the object to be measured contains a first object to be measured, which is present on a surface of the film, and a second object to be measured, which is present in the film, wherein the object to be measured, which is moved by the first recovery operation, contains the first object to be measured, wherein the object to be measured, which is moved by the second recovery operation, contains the second object to be measured, and wherein the analyzer is configured to individually analyze the first object to be measured and the second object to be measured.

According to an embodiment of a substrate contamination analysis system, in the substrate contamination analysis system described above, the analyzer comprises a total reflection X-ray fluorescence spectrometer configured to irradiate the first substrate with primary X-rays at an incident angle of less than a total reflection angle, to thereby analyze the object to be measured based on output florescent X-rays, wherein the recovery device is configured to perform the first recovery operation of moving the first object to be measured to the first measurement position on the film, wherein the total reflection X-ray fluorescence spectrometer is configured to irradiate the first object to be measured with the primary X-rays, to thereby analyze the first object to be measured, wherein the vapor phase decomposition device is configured to dissolve the film under a state in which the first object to be measured is present on the surface of the film, wherein the recovery device is configured to perform, after the film is dissolved, the second recovery operation of moving the second object to be measured as well as the first object to be measured to the second measurement position on the surface of the first substrate, and wherein the total reflection X-ray fluorescence spectrometer is configured to irradiate the second object to be measured as well as the first object to be measured with the primary X-rays, to thereby analyze the first object to be measured and the second object to be measured together, and subtract, from a result of the analysis, an analysis result of the first object to be measured, to thereby calculate an analysis result of the second object to be measured.

According to an embodiment of a substrate contamination analysis system, in the substrate contamination analysis system described above, the first measurement position and the second measurement position are the same position on the first substrate.

According to an embodiment of a substrate contamination analysis system, in the substrate contamination analysis system described above, the recovery device is configured to perform the first recovery operation of moving the first object to be measured to the first measurement position on a surface of a second substrate different from the first substrate, wherein the vapor phase decomposition device is configured to dissolve the film under a state in which the first object to be measured has been removed from the surface of the film, wherein the recovery device is configured to perform, after the film is dissolved, the second recovery operation of moving the second object to be measured to the second measurement position on the surface of the first substrate, and wherein the total reflection X-ray fluorescence spectrometer is configured to analyze the first object to be measured while the recovery device performs the second recovery operation, and analyze the second object to be measured after the recovery device performs the second recovery operation.

According to an embodiment of a substrate contamination analysis system, in the substrate contamination analysis system described above, the recovery device is configured to perform the first recovery operation of moving the first object to be measured to the first measurement position on a surface of a second substrate different from the first substrate, wherein the vapor phase decomposition device is configured to dissolve the film under a state in which the first object to be measured has been removed from the surface of the film, wherein the recovery device is configured to perform, after the film is dissolved, the second recovery operation of moving the second object to be measured to the second measurement position on the surface of the second substrate, and wherein the total reflection X-ray fluorescence spectrometer is configured to individually irradiate the first object to be measured and the second object to be measured, which have been moved to the surface of the second substrate, with primary X-rays, to thereby individually analyze the first object to be measured and the second object to be measured.

According to an embodiment of a substrate contamination analysis system, in the substrate contamination analysis system described above, the recovery device includes a nozzle including a drop port configured to drop a liquid droplet configured to take in the object to be measured and a jet port configured to spray a gas to a periphery of the dropped liquid droplet.

According to an embodiment of a substrate contamination analysis system, in the substrate contamination analysis system described above, the recovery device further includes a droplet holding portion configured to hold the liquid droplet when moving the liquid droplet having recovered the object to be measured.

According to an embodiment of a substrate contamination analysis system, in the substrate contamination analysis system described above, the liquid droplet dropped by the recovery device in the first recovery operation comprises a solution containing nitric acid, and wherein the liquid droplet dropped by the recovery device in the second recovery operation comprises a solution containing hydrofluoric acid.

According to an embodiment of a substrate contamination analysis system, in the substrate contamination analysis system described above, the analyzer comprises an inductively coupled plasma mass spectrometry instrument or an atomic absorption spectrometry instrument.

According to the invention described above, impurities present in a film and impurities present on a surface of the film can be individually analyzed.

In addition, according to the invention described above, the time required for analysis can be shortened.

In addition, according to the invention described above, when the substrate is reused, time and effort for performing reprocessing can be saved.

In addition, according to the invention described above, when the recovery operation is performed, the liquid droplet can be prevented from remaining on the substrate.

DESCRIPTION OF EMBODIMENTS

First Embodiment

Figure 1:
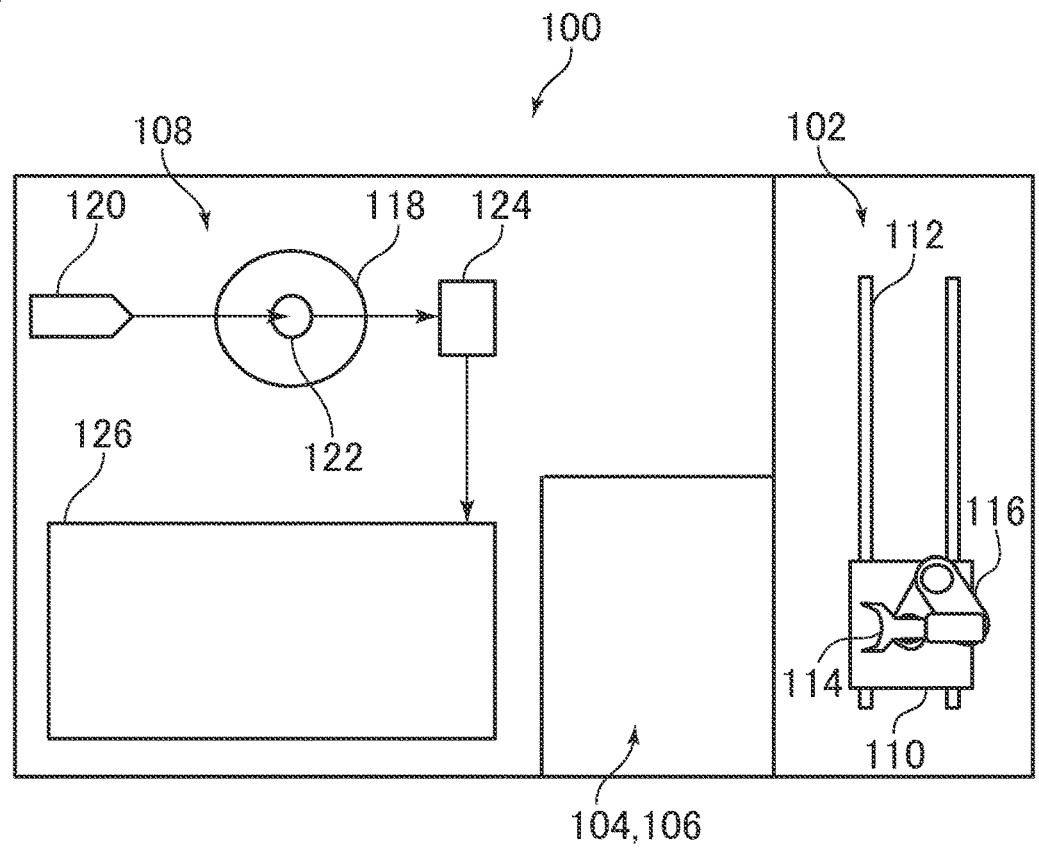
FIG. 1 are each a view for schematically illustrating a substrate contamination analysis system according to the present invention.
Figure 1:
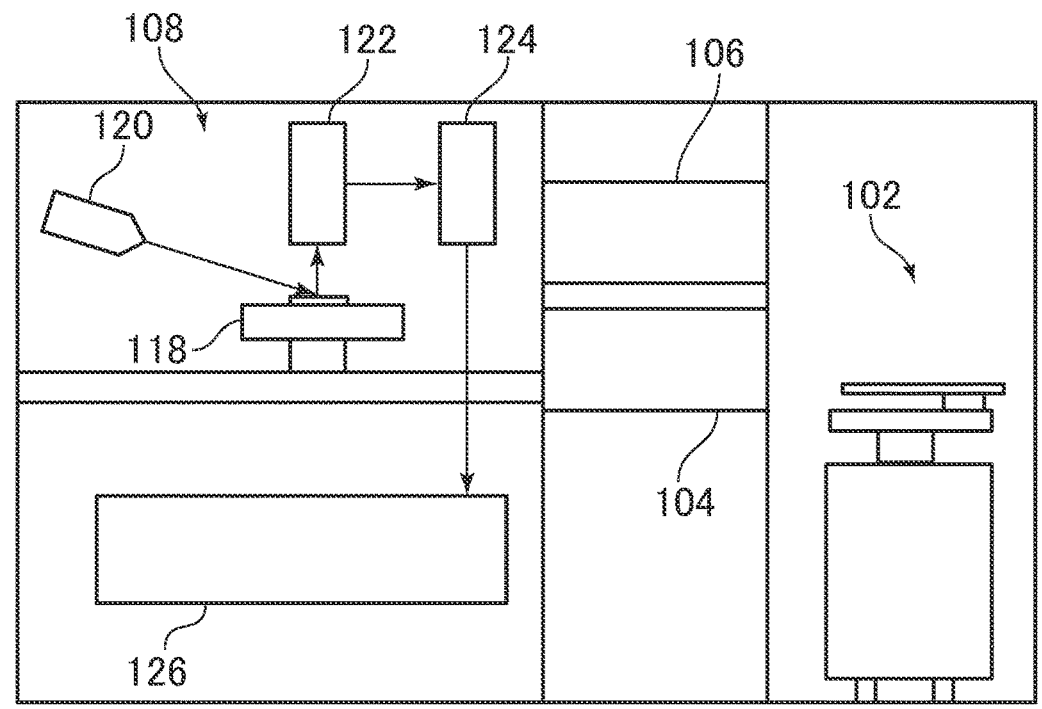

Now, a preferred embodiment (hereinafter referred to as "first embodiment") of the present invention will be described. FIG. 1(*a*) is a view of a substrate contamination analysis system 100 according to the present invention in top view. FIG. 1(*b*) is a view of the substrate contamination analysis system 100 according to the present invention in side view. The substrate contamination analysis system 100 includes a conveying device 102, a vapor phase decomposition device 104, a recovery device 106, and an X-ray fluorescence spectrometer 108.

The arrangement layout illustrated in FIG. 1 is merely one example, and another arrangement layout may be used. For example, an analyzer included in the substrate contamination analysis system 100 illustrated in FIG. 1 is the X-ray fluorescence spectrometer 108. However, the substrate contamination analysis system may have a configuration including an inductively coupled plasma mass spectrometry instrument or an atomic absorption spectrometry instrument instead of the X-ray fluorescence spectrometer 108. The details of the inductively coupled plasma mass spectrometry instrument and the atomic absorption spectrometry instrument are the same as those of the related art, and hence description thereof is omitted.

The conveying device 102 is configured to convey a substrate to be measured. Specifically, for example, the conveying device 102 includes a pedestal 110 that can be changed in height, rails 112 configured to move the pedestal 110, a hand 114 configured to place the substrate, and an extendable/contractible portion 116 that can be extended or contracted. The conveying device 102 is configured to convey the substrate among the vapor phase decomposition device 104, the recovery device 106, and the X-ray fluorescence spectrometer 108 through operation of the pedestal 110, the rails 112, and the extendable/contractible portion 116. The substrate encompasses a first substrate 602 and a second substrate 604 described later.

Figure 2:
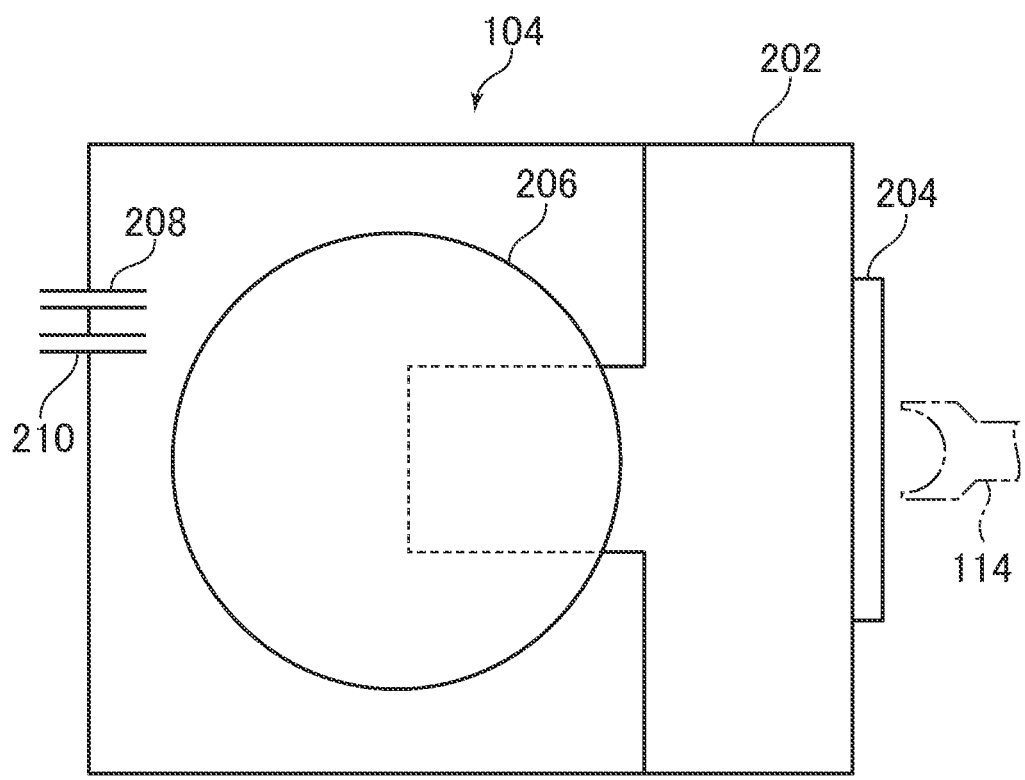
FIG. 2 are each a view for schematically illustrating a vapor phase decomposition device.
Figure 2:
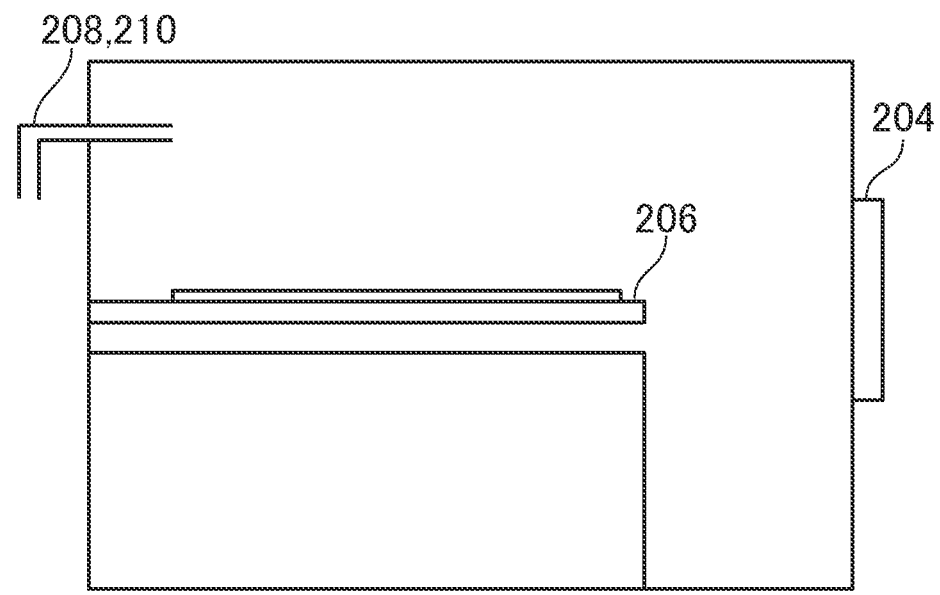

FIG. 2(a) is a view of the vapor phase decomposition device 104 in top view. FIG. 2(b) is a view of the vapor phase decomposition device 104 in side view. The vapor phase decomposition device 104 includes a vapor phase decomposition chamber 202, a shutter 204, a substrate placement table 206, an introduction pipe 208, and a discharge pipe 210. The vapor phase decomposition chamber 202 is made of a material that is not corroded with hydrofluoric acid, for example, polytetrafluoroethylene.

The shutter 204 is arranged at a loading port formed on a surface adjacent to a chamber in which the conveying device 102 is arranged. The shutter 204 is opened and closed when the substrate is loaded to or unloaded from the vapor phase decomposition device 104. The substrate conveyed by the conveying device 102 is placed on the substrate placement table 206. The introduction pipe 208 is configured to introduce a gas or the like for dissolving a film formed on the surface of the substrate into the vapor phase decomposition chamber 202. The discharge pipe 210 is configured to discharge the gas from the vapor phase decomposition chamber 202.

Figure 6:
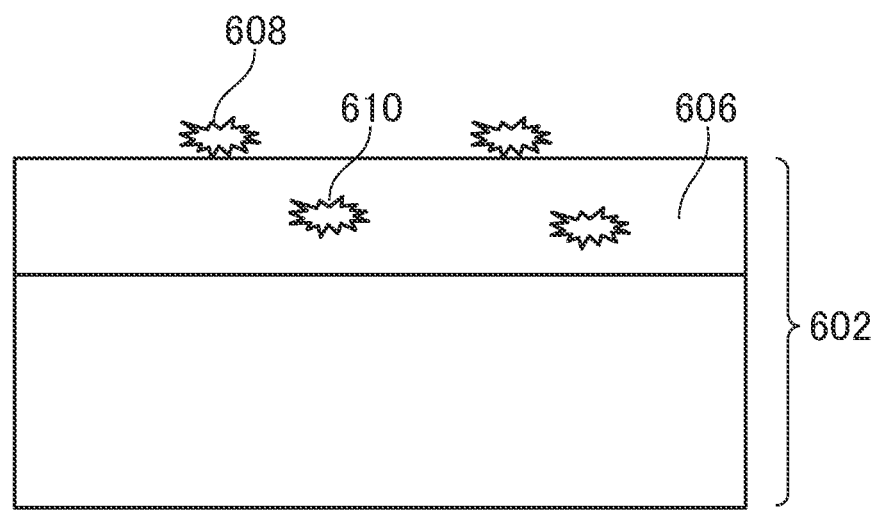
FIG. 6 are each a view for illustrating a processing step in the first embodiment.
Figure 6:
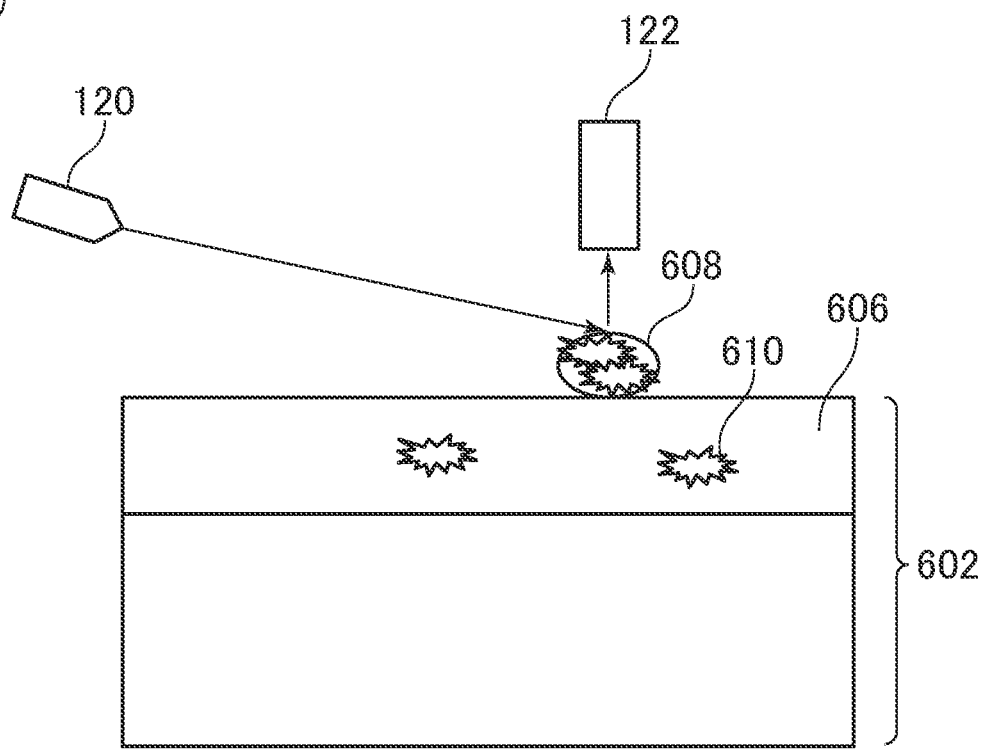

In this case, a first substrate 602 (see FIG. 6) is a substrate to be measured. The first substrate 602 is, for example, a Si substrate having a film of $SiO_2$ or the like formed on a surface. The Si substrate includes an object to be measured, which is an analysis target. The object to be measured includes a first object 608 to be measured (see FIG. 6), which is present on the surface of the film, and a second object 610 to be measured, which is present in the film. Specifically, the first object 608 to be measured is, for example, impurities adhering to the surface of the $SiO_2$ film after the $SiO_2$ film is formed on the Si substrate. In addition, the second object 610 to be measured (see FIG. 6) is impurities mixed in the film of $SiO_2$ in the process of forming $SiO_2$ or the like. The first object 608 to be measured and the second object 610 to be measured are, for example, Fe and Ni.

The vapor phase decomposition device 104 is configured to expose the film formed on the surface of the first substrate 602 to a gas that reacts with the film, to thereby dissolve the film. For example, the vapor phase decomposition device 104 is configured to expose the Si substrate to hydrogen fluoride, to thereby dissolve the $SiO_2$ film on the surface. The chemical reaction is represented by the following chemical formula.

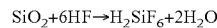

$$SiO_2 + 6HF \rightarrow H_2SiF_6 + 2H_2O \qquad \text{[Chem. 1]}$$

Specifically, first, the shutter 204 is opened. The first substrate 602 is conveyed to the vapor phase decomposition chamber 202 through the loading port by the conveying device 102, and placed on the substrate placement table 206. The shutter 204 is closed after the hand 114 is moved to the outside of the loading port. After that, hydrofluoric acid is introduced into the vapor phase decomposition chamber 202 through the introduction pipe 208. The hydrofluoric acid dissolves the film of $SiO_2$ or the like formed on the surface of the first substrate 602. After the film is dissolved, the hydrofluoric acid is discharged through the discharge pipe 210.

FIG. 3(a) is a view of the recovery device 106 in top view. FIG. 3(b) is a view of the recovery device 106 in side view. The recovery device 106 is configured to perform a first recovery operation of moving the object to be measured to a first measurement position before the film is dissolved, and a second recovery operation of moving the object to be measured to a second measurement position after the film is dissolved. The object to be measured, which is moved by the first recovery operation, includes the first object 608 to be measured, and the object to be measured, which is moved by the second recovery operation, includes the second object 610 to be measured.

Figure 3:
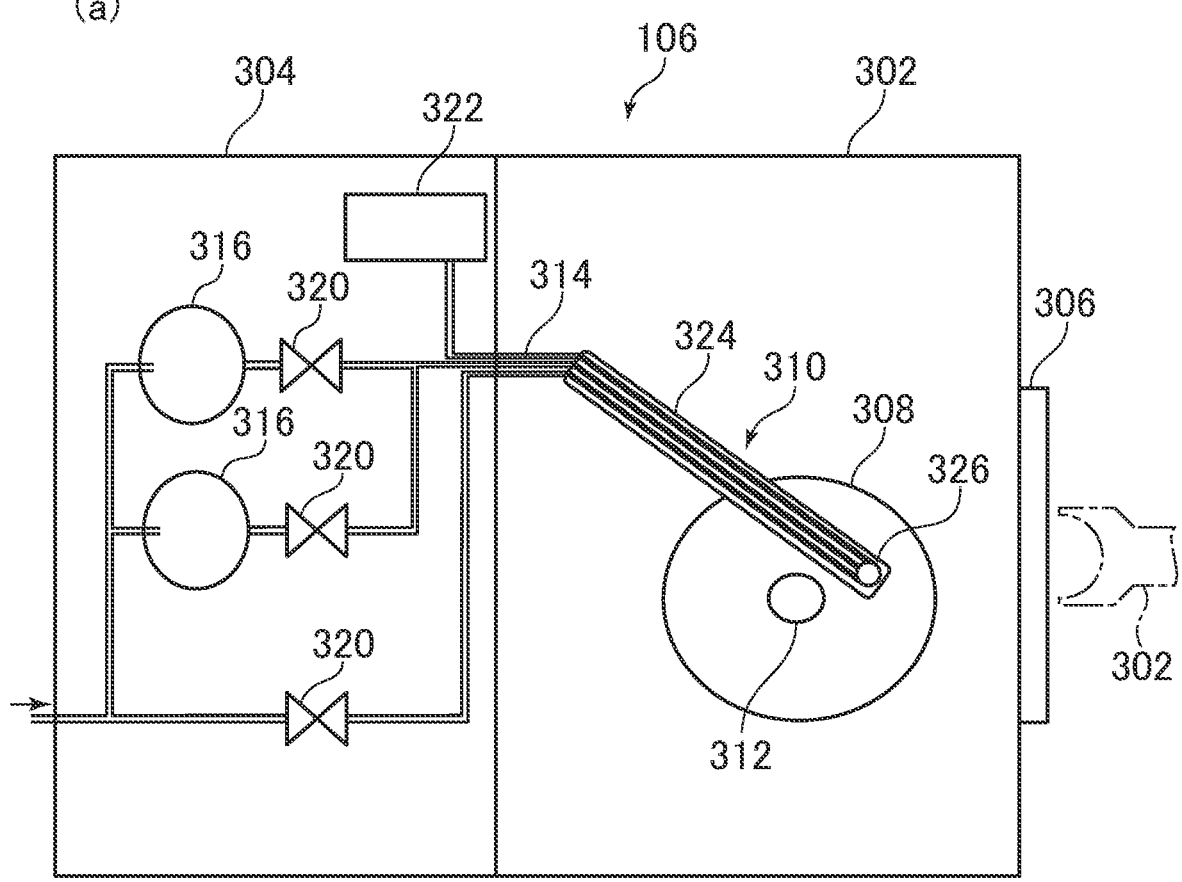
FIG. 3 are each a view for schematically illustrating a recovery device.
Figure 3:
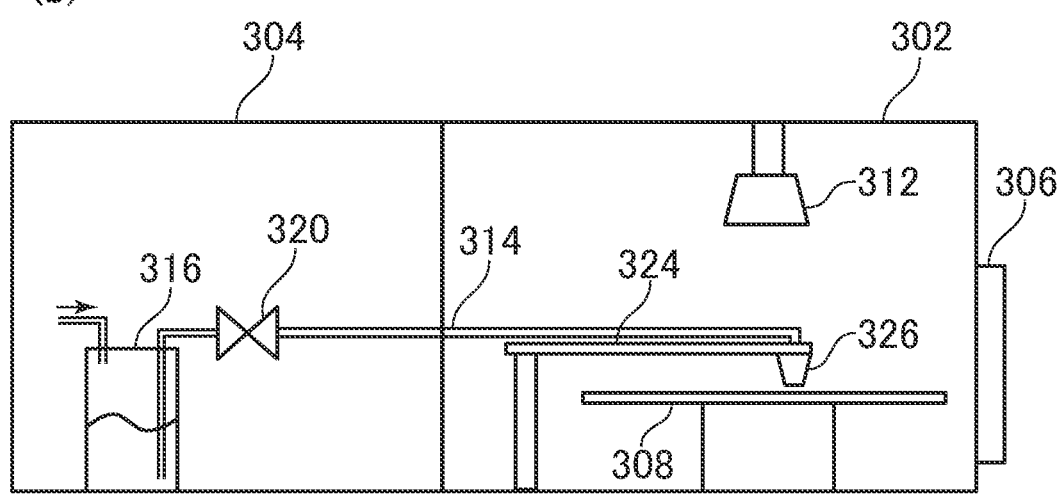

The recovery device 106 includes a recovery chamber 302 and a storage chamber 304. In the recovery chamber 302, there are arranged a shutter 306, a rotating table 308, a recovery portion 310, a drying portion 312, and pipes 314. In the storage chamber 304, there are arranged the pipes 314, liquid containers 316, control valves 320, and a pump 322. In FIG. 3, the recovery chamber 302 and the storage chamber 304 are arranged adjacent to each other. However, the storage chamber 304 may be arranged in a place away from the recovery chamber 302. In addition, the storage chamber 304 may be omitted.

The shutter 306 is arranged at a loading port formed on a surface adjacent to the chamber in which the conveying device 102 is arranged. The shutter 306 is opened and closed when the substrate is loaded to or unloaded from the recovery chamber 302. The rotating table 308 is configured to rotate the substrate within a horizontal plane. The substrate is placed on the rotating table 308 with the center thereof being aligned with a rotation axis of the rotating table 308.

The recovery portion 310 is configured to drop a liquid droplet onto the substrate and move the dropped liquid droplet on the surface of the substrate, to thereby take the object to be measured into the liquid droplet. The recovery portion 310 is configured to release the liquid droplet from a nozzle 326 at a predetermined position of the substrate after recovering the object to be measured into the liquid droplet. With this, the liquid droplet having taken in the object to be measured is left at the predetermined position on the substrate.

Specifically, the recovery portion 310 includes a recovery arm 324, the nozzle 326, and a droplet holding portion 410. In the recovery arm 324, the nozzle 326 is mounted to a distal end portion of the recovery arm 324, and the pipes 314 connected to the nozzle 326 are arranged. The recovery arm 324 is configured to move the liquid droplet from the center of the substrate to an end portion of the substrate under a state in which the nozzle 326 holds the liquid droplet. When the recovery arm 324 moves the liquid droplet, the liquid droplet takes in the object to be measured adhering to the entire substrate through rotation of the substrate by the rotating table 308.

Figure 4:
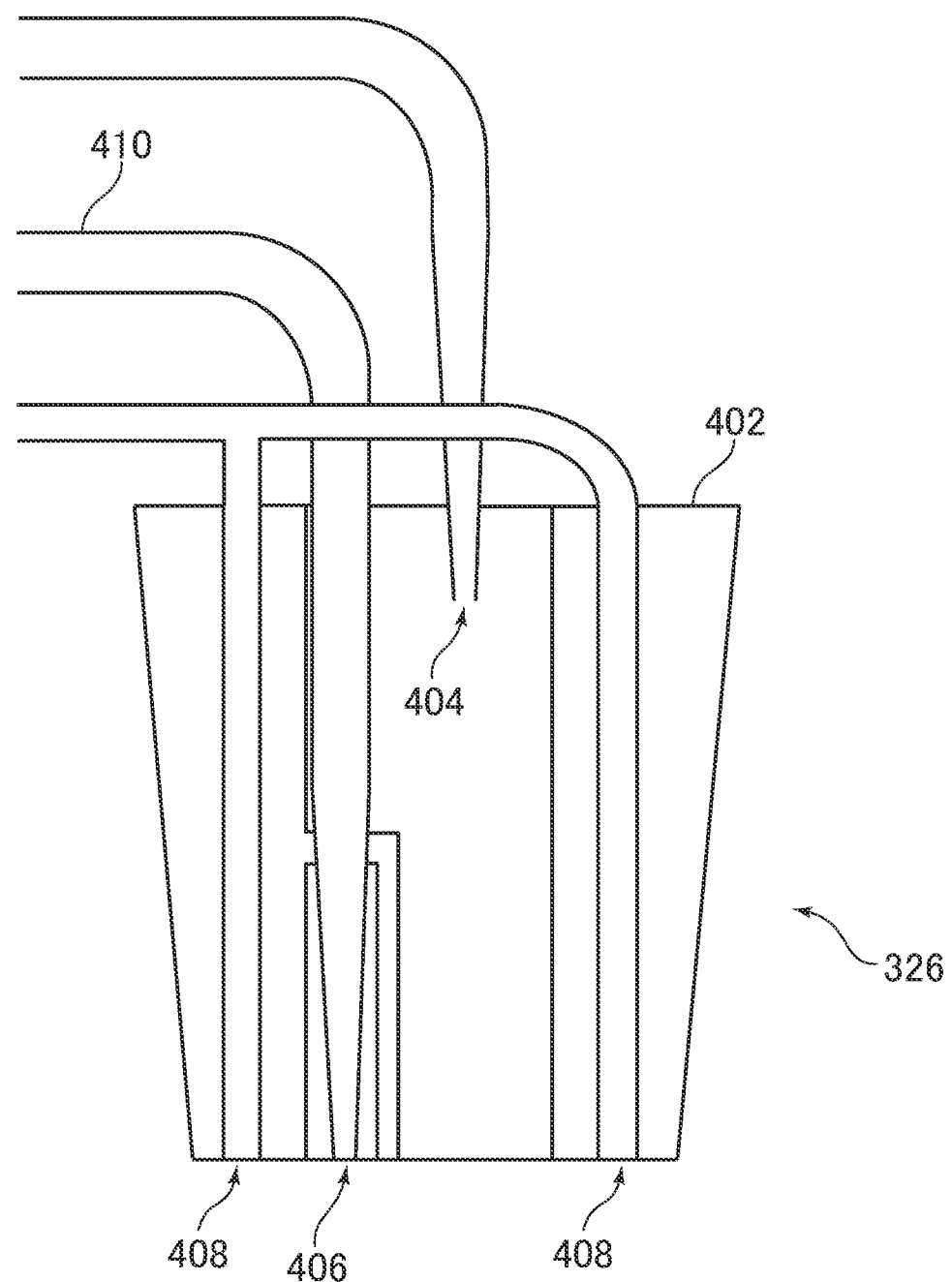
FIG. 4 is a view for schematically illustrating a vicinity of a nozzle.

FIG. 4 is a sectional view for schematically illustrating a vicinity of the nozzle 326. The nozzle 326 includes a housing 402, a drop port 404, a suction port 406, and a jet port 408. In the housing 402, there are arranged the drop port 404, the suction port 406, and the jet port 408.

The drop port 404 is connected to the pipes 314, and is configured to drop the liquid droplet supplied from each of the liquid containers 316 onto the substrate. The liquid droplet is configured to take in the object to be measured. For example, the liquid droplet dropped by the recovery device 106 in the first recovery operation is a solution containing nitric acid. In addition, the liquid droplet dropped by the recovery device 106 in the second recovery operation is a solution containing a hydrofluoric acid solution. A distal end of the drop port 404 is arranged away from a surface of the housing 402 opposed to the substrate. With this, the liquid droplet held by the nozzle 326 after being dropped can be prevented from being brought into contact with the drop port 404.

The suction port 406 is connected to the pump 322 through the droplet holding portion 410 and the pipes 314. The suction port 406 is configured to suck up the liquid droplet having taken in the object to be measured. The liquid droplet having been sucked up is held by the droplet holding portion 410. The droplet holding portion 410 is configured to hold the liquid droplet when the liquid droplet having recovered the object to be measured is moved from the first substrate 602 to the second substrate 604. The droplet holding portion 410 is, for example, a syringe.

The jet port 408 is configured to spray a gas to a periphery of the dropped liquid droplet. Specifically, the jet port is arranged so as to surround the center of the housing 402, and is configured to spray a gas, for example, nitrogen, to the periphery of the dropped liquid droplet. With this, even when the wettability of the substrate is high, the situation, in which the liquid droplet having taken in the object to be measured is released from the nozzle 326 when the nozzle 326 is moved, is prevented.

The drying portion 312 is configured to dry the liquid droplet so that the object to be measured is held on the surface of the substrate. Specifically, the drying portion 312 is, for example, a halogen lamp, and is arranged above the liquid droplet by drying portion moving means (not shown). The drying portion 312 is configured to heat and dry the liquid droplet released from the nozzle 326. In a region of the substrate in which the liquid droplet has been dried, the object to be measured, which is a measurement target, is left.

In the case of a configuration in which the inductively coupled plasma mass spectrometry instrument or the atomic absorption spectrometry instrument is provided instead of the X-ray fluorescence spectrometer 108, the object to be measured is transferred to a container (not shown) in a liquid state and conveyed to the analyzer. The container is, for example, a vial. In the case of such configuration, the drying portion 312 may be omitted from the recovery device 106.

Each of the liquid containers 316 contains a liquid supplied to the nozzle 326. Specifically, two liquid containers 316 are arranged in the storage chamber 304. The two liquid containers 316 contain two different kinds of liquids, respectively. For example, one of the liquid containers 316 contains a solution containing nitric acid. Another of the liquid containers 316 contains a solution containing a hydrofluoric acid solution. Each of the liquid containers 316 is configured to supply the liquid therein to the nozzle 326 under application of pressure from outside through the pipe 314. The control valve 320 is provided to each of the pipes 314 configured to supply a gas or a liquid to the nozzle 326, and is configured to control the amount of the liquid or the gas supplied to the nozzle 326.

The pipes 314 are configured to connect the nozzle 326 to the liquid containers 316 or the pump 322. In addition, the pipes are configured to connect the nozzle 326 to gas containers (not shown) arranged outside the recovery device 106. Specifically, an end portion on one side of the pipes 314 is connected to the drop port 404 of the nozzle 326, and an end portion on another side of the pipes 314 is branched to be connected to the liquid containers 316 containing nitric acid and a hydrofluoric acid solution, respectively. In addition, the pipes 314 are configured to connect the droplet holding portion 410 to the pump 322. Further, the pipes 314 are configured to connect the jet port 408 to a gas container having nitrogen sealed therein.

The pump 322 is configured to suck up the liquid droplet dropped onto the substrate into the droplet holding portion 410 by controlling atmospheric pressures in the pipes 314 and the droplet holding portion 410. With this, the liquid droplet is held by the droplet holding portion 410.

The X-ray fluorescence spectrometer 108 is configured to irradiate the object to be measured with primary X-rays, to thereby analyze the object to be measured based on the output fluorescent X-rays, every time the recovery device 106 performs the first recovery operation and the second recovery operation. The X-ray fluorescence spectrometer 108 in the first embodiment is a total reflection X-ray fluorescence spectrometer 108 configured to irradiate the first substrate 602 with the primary X-rays at an incident angle of less than a total reflection angle to cause the primary X-rays to be totally reflected.

The X-ray fluorescence spectrometer 108 includes a sample stage 118, an X-ray source 120, a detector 122, a counter 124, and an analysis portion 126. A sample to be measured is placed on the sample stage 118. Specifically, as illustrated in FIG. 1, the substrate is placed on the sample stage 118 with a measurement surface being placed on an upper side.

The X-ray source 120 is configured to irradiate the surface of the substrate with the primary X-rays that generate fluorescent X-rays. Specifically, the X-ray source 120 is configured to irradiate the first object 608 to be measured or the second object 610 to be measured, which is arranged on the surface of the substrate, with the primary X-rays. The first object 608 to be measured or the second object 610 to be measured, which has been irradiated with the primary X-rays, output the fluorescent X-rays.

The detector 122 is a Si (Li) detector, a SDD, or the like. Specifically, the detector 122 is configured to measure fluorescent X-ray intensity and output a pulse signal having a pulse height corresponding to the energy of the measured fluorescent X-rays.

The counter 124 is configured to count the pulse signal output as measurement intensity of the detector 122 in accordance with the pulse height. Specifically, the counter 124 is, for example, a multichannel analyzer, and is configured to count the output pulse signal of the detector 122 for each channel corresponding to the energy of the fluorescent X-rays and output the result as the fluorescent X-ray intensity. When the fluorescent X-rays are dispersed, the counter 124 configured to acquire the output of the detector 122 configured to measure the dispersed fluorescent X-rays may be a single-channel analyzer configured to count the pulse signal only within a range of the pulse height corresponding to the dispersed energy.

The analysis portion 126 is configured to perform quantitative analysis of elements contained in the sample based on the count result of the counter 124. Specifically, for example, the analysis portion 126 is configured to perform quantitative analysis by a calibration curve method or a fundamental parameter (FP) method through use of the count result of the counter 124.

In this case, the analysis portion 126 is configured to individually analyze the first object 608 to be measured and the second object 610 to be measured. In the first embodiment, the X-ray source 120 irradiates the first object 608 to be measured, which is present on the surface of the film, with the primary X-rays and then, the analysis portion 126 analyzes the first object 608 to be measured. Further, the X-ray source 120 irradiates the second object 610 to be measured as well as the first object 608 to be measured, which are present on the surface of the first substrate 602, with the primary X-rays and then, the analysis portion 126 analyzes the first object 608 to be measured and the second object 610 to be measured together. The analysis portion 126 is configured to subtract, from a result of the analysis, an analysis result of the first object 608 to be measured, to thereby calculate an analysis result of the second object 610 to be measured.

Figure 5:
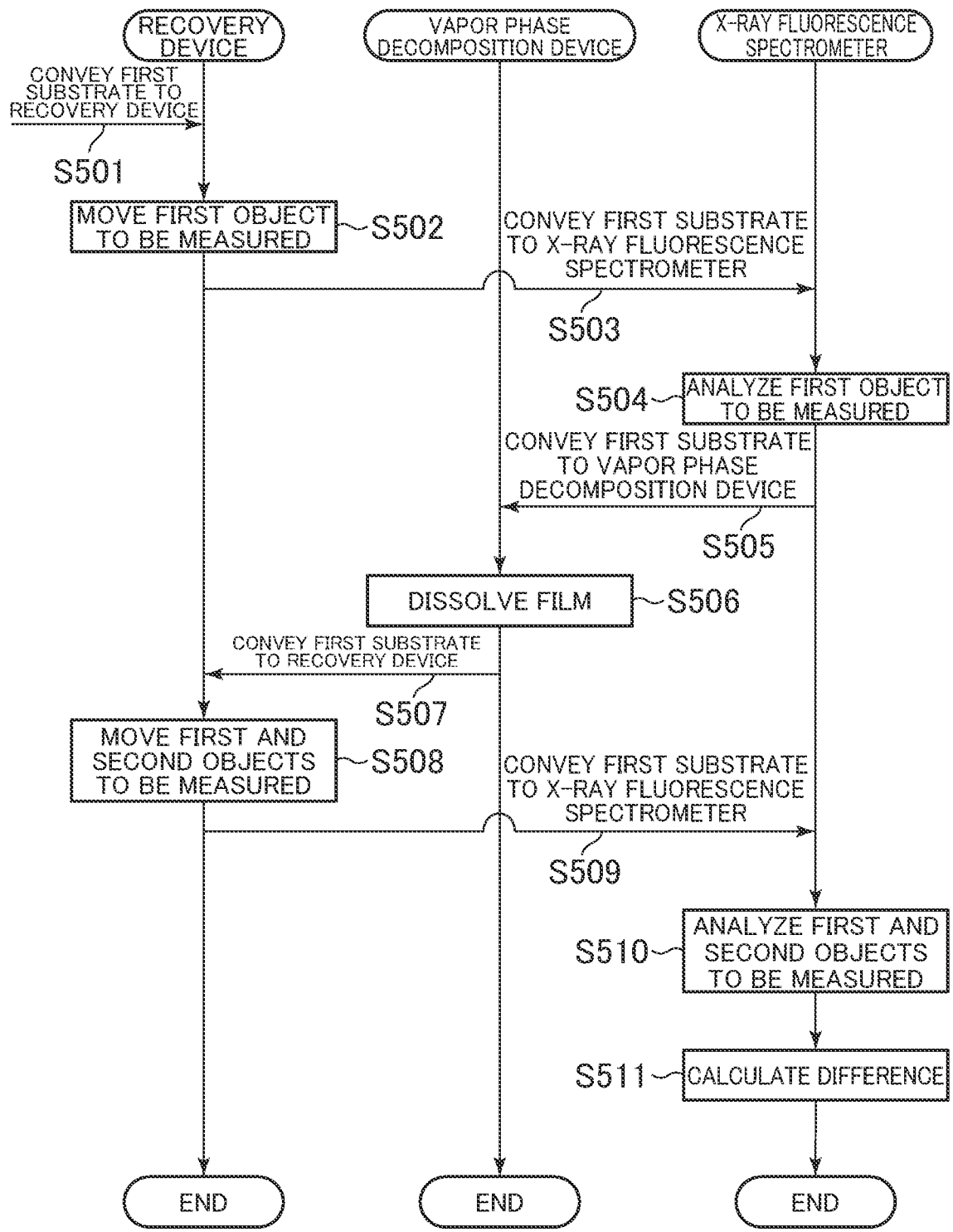
FIG. 5 is a diagram for illustrating a processing flow in a first embodiment.

Next, the processing performed by the substrate contamination analysis system 100 in the first embodiment will be described with reference to a flowchart illustrated in FIG. 5. As illustrated in FIG. 6(a), the first substrate 602 is a Si substrate having a SiO$_2$ film formed on a surface, in which the first object 608 to be measured is present on the surface of the SiO$_2$ film, and the second object 610 to be measured is present in the SiO$_2$ film. In addition, description will be given assuming that, as an initial state, the first substrate 602 is placed in a preparation chamber adjacent to a conveying chamber in which the conveying device 102 is provided.

First, the conveying device 102 conveys the first substrate 602 to the recovery device 106 (Step S501). Specifically, the conveying device 102 conveys the first substrate 602 placed in the preparation chamber to the rotating table 308 of the recovery device 106.

The recovery device 106 moves the first object 608 to be measured to the first measurement position on the film (first recovery operation) (Step S502). Specifically, the recovery device 106 drops a solution containing nitric acid from the drop port 404 of the nozzle 326 and rotates the rotating table 308 while moving the recovery arm 324. With this, the first object 608 to be measured, which adheres to the surface of a SiO$_2$ film 606, is taken into the dropped liquid droplet containing nitric acid. The liquid droplet is released from the nozzle 326 at the first measurement position. After that, the drying portion 312 dries the liquid droplet, with the result that the first object 608 to be measured is left at the first measurement position on the first substrate 602.

The conveying device 102 conveys the first substrate 602 to the X-ray fluorescence spectrometer 108 (Step S503). Specifically, the conveying device 102 conveys the first substrate 602 from the recovery device 106 to the sample stage 118 of the X-ray fluorescence spectrometer 108.

The X-ray fluorescence spectrometer 108 irradiates the first object 608 to be measured with the primary X-rays, to thereby analyze the first object 608 to be measured (Step S504). Specifically, as illustrated in FIG. 6(b), the total reflection X-ray fluorescence spectrometer 108 irradiates the first measurement position of the first substrate 602 with the primary X-rays at a low incident angle. In this case, the primary X-rays are radiated to the first substrate 602 at the low incident angle, and hence are totally reflected from the surface of the SiO$_2$ film 606. Thus, the primary X-rays do not travel to the inside of the SiO$_2$ film 606, and hence fluorescent X-rays are not output from the second object 610 to be measured, which is present in the SiO$_2$ film 606. The detector 122 measures the intensity of the fluorescent X-rays output from the first object 608 to be measured and output a pulse signal to the counter 124. The analysis portion 126 analyzes elements contained in the first object 608 to be measured based on the output from the counter 124. For example, the analysis portion 126 acquires an analysis result that the first object 608 to be measured contains $3.0 \times 10^{10}$ atoms/cm$^2$ of Fe elements and $1.5 \times 10^{10}$ atoms/cm$^2$ of Ni elements.

In the case of a configuration in which the inductively coupled plasma mass spectrometry instrument is provided, the inductively coupled plasma mass spectrometry instrument introduces the first object 608 to be measured, which has been atomized, into an argon plasma. Then, the inductively coupled plasma mass spectrometry instrument measures a luminescent line (spectral line) that is released when excited atoms contained in the first object 608 to be measured return to a low energy level, to thereby analyze the elements in the first object 608 to be measured. In addition, in the case of a configuration in which the atomic absorption spectrometry instrument is provided, the atomic absorption spectrometry instrument irradiates the first object 608 to be measured, which has been atomized, with light, and measures an absorption spectrum thereof, to thereby analyze the elements in the first object 608 to be measured.

The conveying device 102 conveys the first substrate 602 to the vapor phase decomposition device 104 (Step S505). Specifically, the conveying device 102 conveys the first substrate 602 from the X-ray fluorescence spectrometer 108 to the substrate placement table 206 of the vapor phase decomposition device 104.

Figure 7:
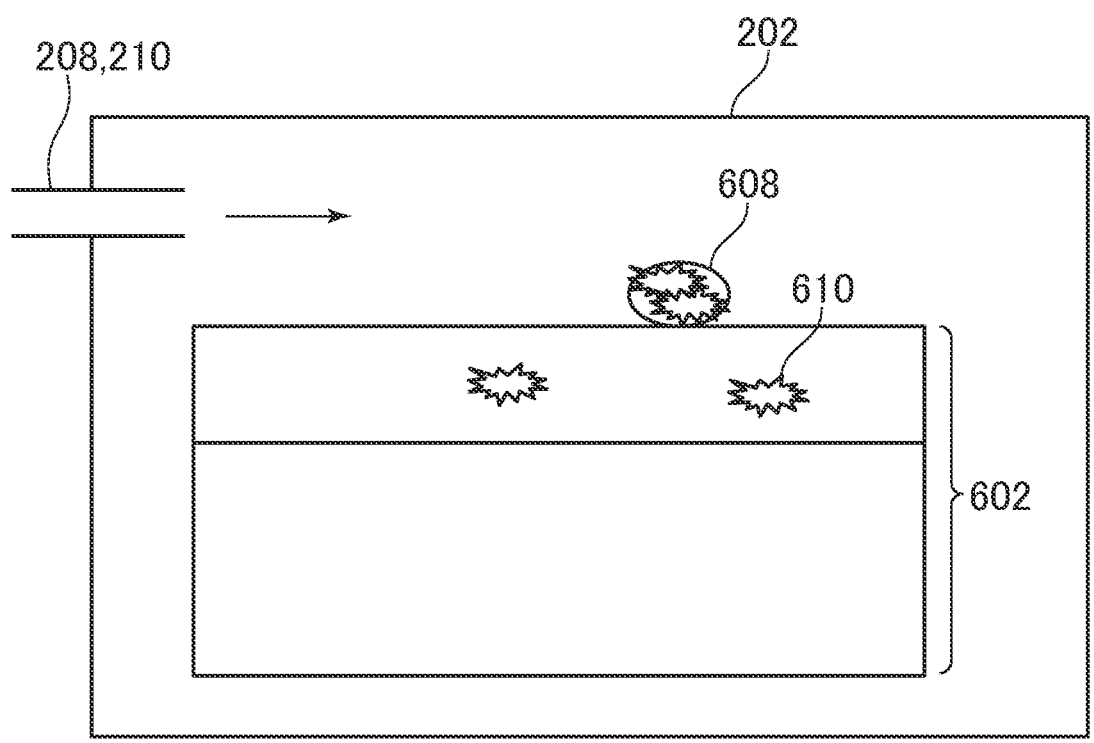
FIG. 7 are each a view for illustrating a processing step in the first embodiment.
Figure 7:
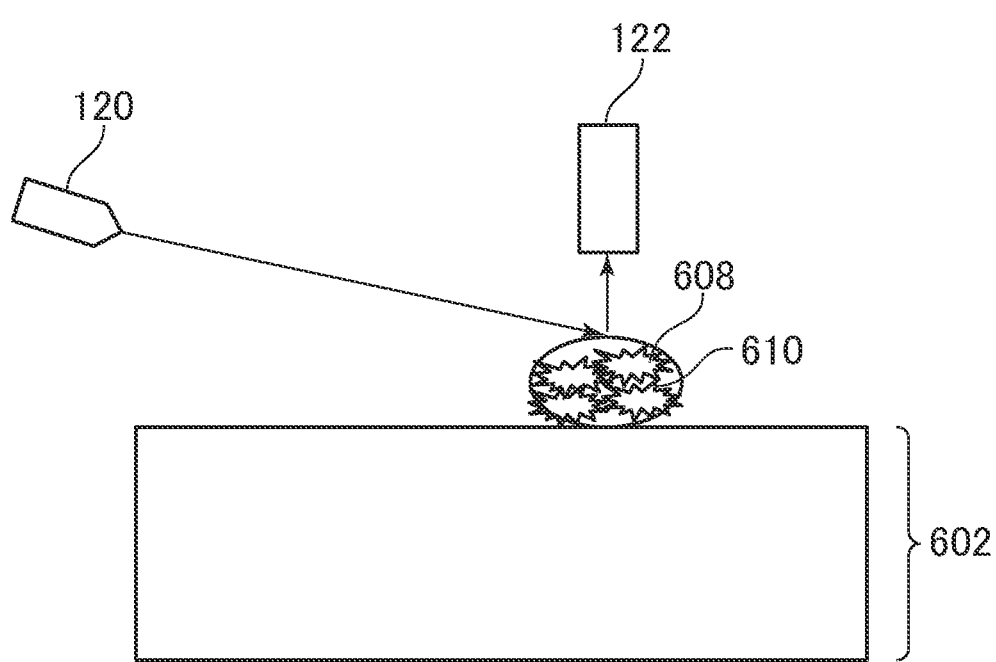

The vapor phase decomposition device 104 dissolves the film under a state in which the first object 608 to be measured is present on the surface of the film (Step S506). Specifically, as illustrated in FIG. 7(a), the vapor phase decomposition device 104 introduces hydrofluoric acid into the vapor phase decomposition chamber 202, to thereby dissolve the SiO$_2$ film 606 under a state in which the first object 608 to be measured is present on the surface of the SiO$_2$ film 606. With this, the first object 608 to be measured and the second object 610 to be measured contained in the SiO$_2$ film 606 are left on the surface of the first substrate 602.

The conveying device 102 conveys the first substrate 602 to the recovery device 106 (Step S507). Specifically, the conveying device 102 conveys the first substrate 602 from the vapor phase decomposition device 104 to the rotating table 308 of the recovery device 106.

After the film is dissolved, the recovery device 106 moves the second object 610 to be measured as well as the first object 608 to be measured to the second measurement position on the surface of the first substrate 602 (second recovery operation) (Step S508). Specifically, the recovery device 106 drops a solution containing a hydrofluoric acid solution from the drop port 404 of the nozzle 326 and rotates the rotating table 308 while moving the recovery arm 324. With this, the first object 608 to be measured, which adheres to the surface of the SiO$_2$ film 606, and the second object 610 to be measured, which is contained in the SiO$_2$ film 606, are taken into the dropped liquid droplet containing a hydrofluoric acid solution. The liquid droplet is released from the nozzle 326 at the second measurement position. After that, the drying portion 312 dries the liquid droplet, with the result that the first object 608 to be measured and the second object 610 to be measured are left at the second measurement position on the first substrate 602.

The first measurement position and the second measurement position may be the same position on the first substrate. In addition, the first measurement position and the second measurement position may be different positions on the first substrate.

The conveying device 102 conveys the first substrate 602 to the X-ray fluorescence spectrometer 108 (Step S509). Specifically, the conveying device 102 conveys the first substrate 602 from the recovery device 106 to the sample stage 118 of the X-ray fluorescence spectrometer 108.

The X-ray fluorescence spectrometer 108 irradiates the second object 610 to be measured as well as the first object 608 to be measured, which are present on the surface of the first substrate 602, with the primary X-rays, to thereby analyze the first object 608 to be measured and the second object 610 to be measured together (Step S510). Specifically, the total reflection X-ray fluorescence spectrometer 108 irradiates the second measurement position of the first substrate 602 with the primary X-rays. In this case, as illustrated in FIG. 7(b), the first object 608 to be measured and the second object 610 to be measured are present in a mixed state at the second measurement position. Therefore, the analysis portion 126 analyzes the elements contained in the first object 608 to be measured and the second object 610 to be measured together. For example, the analysis portion 126 acquires an analysis result that the first object 608 to be measured and the second object 610 to be measured contain $5.0 \times 10^{10}$ atoms/cm$^2$ of Fe elements and $2.5 \times 10^{10}$ atoms/cm$^2$ of Ni elements. Also in the case of the configuration in which the inductively coupled plasma mass spectrometry instrument or the atomic absorption spectrometry instrument is provided, the similar analysis result is acquired.

The X-ray fluorescence spectrometer 108 subtracts, from a result of the analysis, an analysis result of the first object 608 to be measured, to thereby calculate an analysis result of the second object 610 to be measured (Step S511).

Specifically, the analysis portion 126 performs calculation of subtracting the analysis result acquired in Step S504 from the analysis result acquired in Step S510. Through this calculation, the analysis portion 126 acquires an analysis result that the second object 610 to be measured contains $2.0 \times 10^{10}$ atoms/cm$^2$ of Fe elements and $1.0 \times 10^{10}$ atoms/cm$^2$ of Ni elements. Also in the case of the configuration in which the inductively coupled plasma mass spectrometry instrument or the atomic absorption spectrometry instrument is provided, analysis result is acquired through the same calculation.

In the case of the configuration in which the inductively coupled plasma mass spectrometry instrument or the atomic absorption spectrometry instrument is provided, after Step S502, the first object 608 to be measured is transferred to a container (not shown) in a liquid state, and introduced into the inductively coupled plasma mass spectrometry instrument or the atomic absorption spectrometry instrument. In addition, after Step S508, the second object 610 to be measured is transferred to a container (not shown) in a liquid state, and introduced into the inductively coupled plasma mass spectrometry instrument or the atomic absorption spectrometry instrument. With this, the first object 608 to be measured and the second object 610 to be measured, which is present in the film, can be individually analyzed.

With the foregoing, the first object 608 to be measured, which is present on the surface of the SiO$_2$ film 606 of the first substrate 602, and the second object 610 to be measured, which is present in the SiO$_2$ film 606, can be individually analyzed.

Second Embodiment

Next, a second embodiment will be described. The configurations of the substrate contamination analysis systems 100 according to the second embodiment and a third embodiment described later are the same as the configuration in the first embodiment illustrated in FIG. 1 to FIG. 4, and hence description thereof is omitted. In addition, also in the second and third embodiments, similarly to the first embodiment, the analyzer included in the substrate contamination analysis system 100 may be the inductively coupled plasma mass spectrometry instrument or the atomic absorption spectrometry instrument.

In the second and third embodiments, it is assumed that the first substrate 602 is the same as that in the first embodiment. In addition, it is assumed that the second substrate 604 is a Si substrate. Further, description is given assuming that the first substrate 602 and the second substrate 604 are placed in the preparation chamber adjacent to the conveying chamber in which the conveying device 102 is provided.

Figure 8:
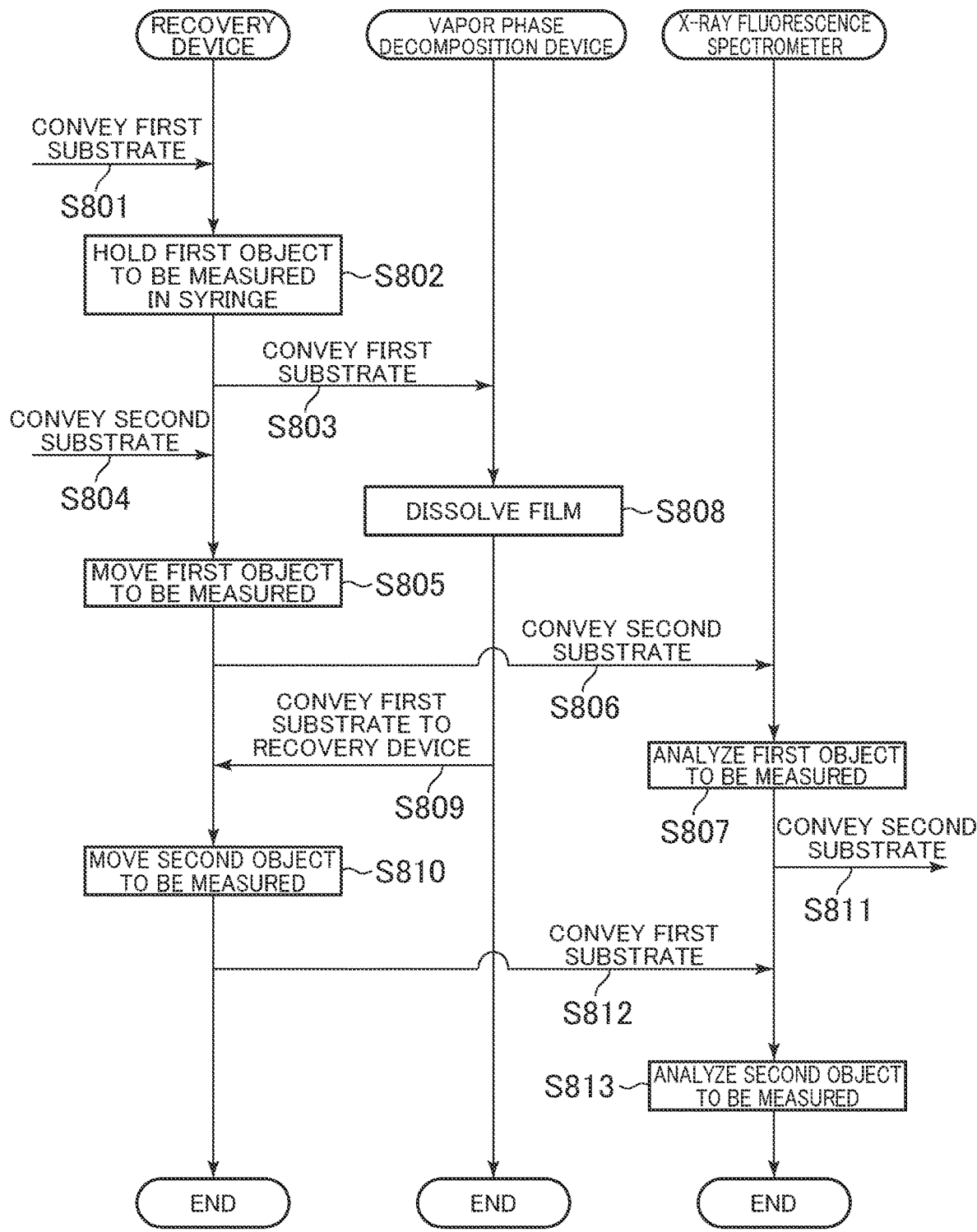
FIG. 8 is a diagram for illustrating a processing flow in a second embodiment.

FIG. 8 is a flowchart for illustrating processing performed by the substrate contamination analysis system 100 according to the second embodiment. First, the conveying device 102 conveys the first substrate 602 to the recovery device 106 (Step S801).

Figure 9:
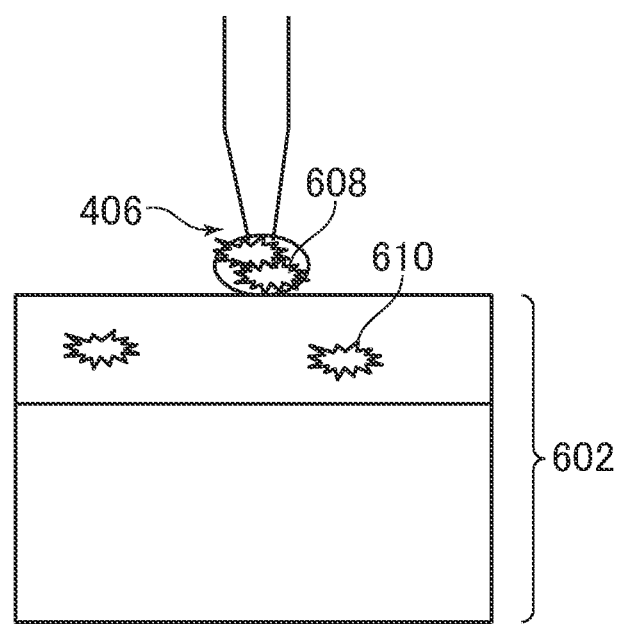
FIG. 9 are each a view for illustrating a processing step in the second embodiment.
Figure 9:
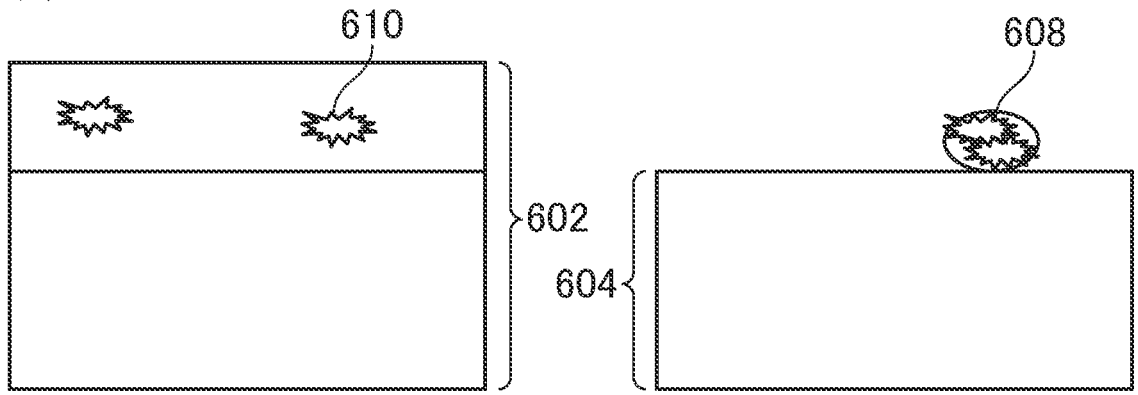

The recovery device 106 holds the first object 608 to be measured in the droplet holding portion 410 (Step S802). Specifically, similarly to the first embodiment, the recovery device 106 drops a solution containing nitric acid from the drop port 404 of the nozzle 326 and rotates the rotating table 308 while moving the recovery arm 324. With this, the first object 608 to be measured, which adheres to the surface of a SiO$_2$ film 606, is taken into the dropped liquid droplet containing nitric acid. As illustrated in FIG. 9(a), the pump 322 controls the atmospheric pressure in each of the pipes 314 and the droplet holding portion 410, to thereby suck up the liquid droplet into the droplet holding portion 410 through the suction port 406. With this, the liquid droplet is held in the droplet holding portion 410. The suction port 406 illustrated in FIG. 9(a) is illustrated by simplifying the nozzle 316 illustrated in FIG. 4.

The conveying device 102 conveys the first substrate 602 to the vapor phase decomposition device 104 (Step S803). In addition, the conveying device 102 conveys the second substrate 604 to the recovery device 106 (Step S804).

The recovery device 106 moves the first object 608 to be measured to the first measurement position on the surface of the second substrate 604 different from the first substrate 602 (Step S805). Specifically, the recovery device 106 drops the liquid droplet held by the droplet holding portion 410 onto the first measurement position on the surface of the second substrate 604. After that, the drying portion 312 dries the liquid droplet, with the result that the first object 608 to be measured is left at the first measurement position on the second substrate 604. With this, as illustrated in FIG. 9(b), the first object 608 to be measured is present at the first measurement position of the second substrate 604, and the second object 610 to be measured is present in the SiO$_2$ film 606 of the first substrate 602. The operation performed by the recovery device 106 in Step S802 to Step S805 corresponds to the first recovery operation.

After that, the conveying device 102 conveys the second substrate 604 to the X-ray fluorescence spectrometer 108 (Step S806).

Figure 10:
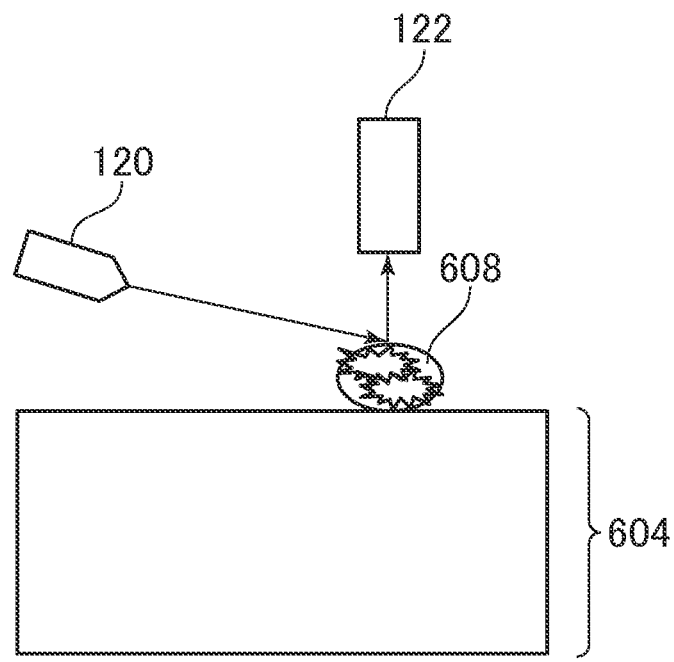
FIG. 10 are each a view for illustrating a processing step in the second embodiment.
Figure 10:
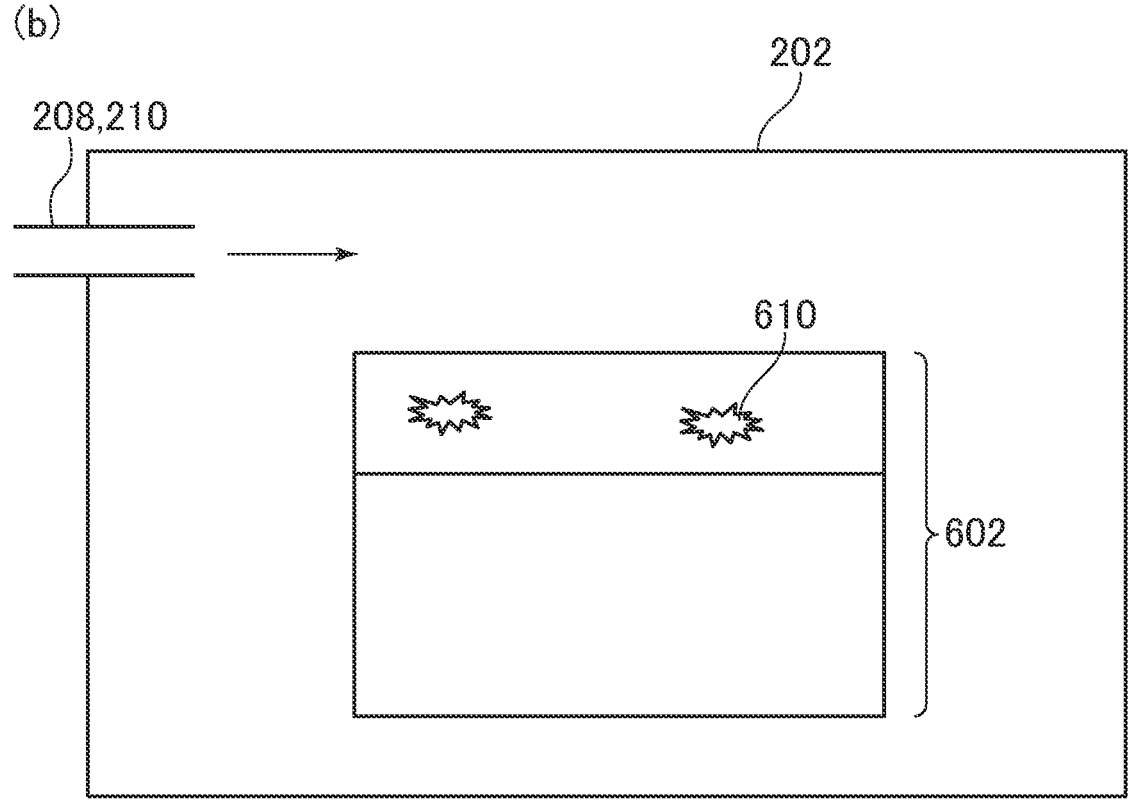

The X-ray fluorescence spectrometer 108 analyzes the first object 608 to be measured moved to the surface of the second substrate 604 while the recovery device 106 performs the second recovery operation (Step S807). Specifically, as illustrated in FIG. 10(a), the X-ray fluorescence spectrometer 108 irradiates the first measurement position of the second substrate 604 with the primary X-rays. Only the first object 608 to be measured is present at the first measurement position, and hence the X-ray fluorescence spectrometer 108 acquires an analysis result of the first object 608 to be measured. For example, the analysis portion 126 acquires an analysis result that the first object 608 to be measured contains $3.0 \times 10^{10}$ atoms/cm$^2$ of Fe elements and $1.5 \times 10^{10}$ atoms/cm$^2$ of Ni elements.

The vapor phase decomposition device 104 dissolves the film under a state in which the first object 608 to be measured has been removed from the surface of the film (Step S808). Specifically, the first object 608 to be measured, which is present on the surface of the SiO$_2$ film 606 of the first substrate 602, has been removed from the surface of the SiO$_2$ film 606 in Step S802. In this state, as illustrated in FIG. 10(b), the vapor phase decomposition device 104 introduces hydrofluoric acid into the vapor phase decomposition chamber 202, to thereby dissolve the SiO$_2$ film 606. With this, the second object 610 to be measured contained in the SiO$_2$ film 606 is left on the surface of the first substrate 602.

The conveying device 102 conveys the first substrate 602 to the recovery device 106 (Step S809). After the film is dissolved, the recovery device 106 moves the second object 610 to be measured to the second measurement position on the surface of the first substrate 602 (second recovery operation) (Step S810). Specifically, the recovery device 106 drops a solution containing a hydrofluoric acid solution from the drop port 404 of the nozzle 326 and rotates the rotating table 308 while moving the recovery arm 324. With this, the second object 610 to be measured, which is contained in the SiO$_2$ film 606, is taken into the dropped liquid droplet containing a hydrofluoric acid solution. The liquid droplet is released from the nozzle 326 at the second measurement position. After that, the drying portion 312 dries the liquid droplet, with the result that the second object 610 to be measured is left at the second measurement position on the first substrate 602.

Step S805 to Step S807 are performed in parallel to Step S808 to Step S810. With this, the step of dissolving the SiO$_2$ film 606, which takes time, and the step of analyzing the first object 608 to be measured, which takes time, can be performed in parallel. Therefore, the time required for performing the entire processing can be shortened.

After the analysis in Step S807 is completed, the conveying device 102 conveys the second substrate 604 to the preparation chamber (Step S811). In addition, the conveying device 102 conveys the first substrate 602 to the X-ray fluorescence spectrometer 108 (Step S812).

Figure 11:
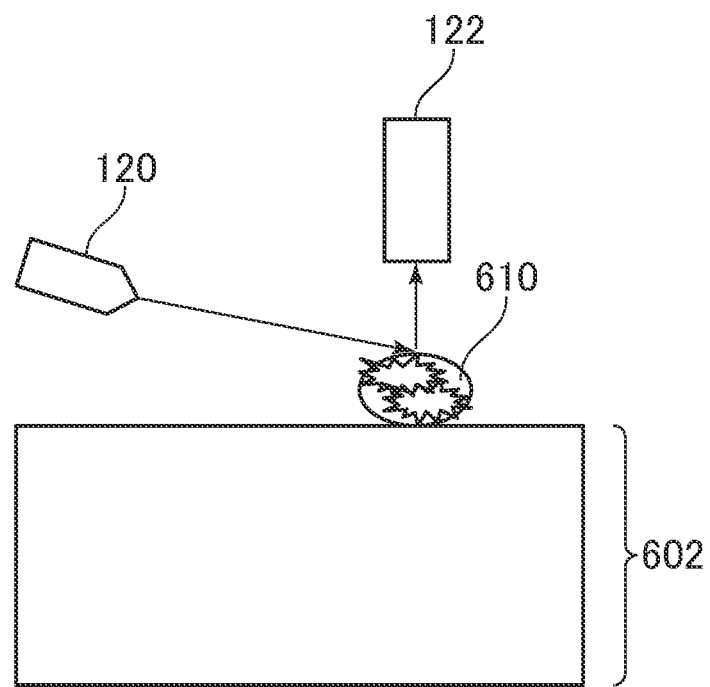
FIG. 11 is a view for illustrating a processing step in the second embodiment.

The X-ray fluorescence spectrometer 108 analyzes the second object 610 to be measured moved to the surface of the first substrate 608 after the recovery device 106 performs the second recovery operation. Specifically, as illustrated in FIG. 11, the X-ray fluorescence spectrometer 108 irradiates the second measurement position of the first substrate 602 with the primary X-rays. Only the second object 610 to be measured is present at the second measurement position, and hence the X-ray fluorescence spectrometer 108 acquires an analysis result of the second object 610 to be measured. For example, the analysis portion 126 acquires an analysis result that the second object 610 to be measured contains $2.0 \times 10^{10}$ atoms/cm$^2$ of Fe elements and $1.0 \times 10^{10}$ atoms/cm$^2$ of Ni elements.

With the foregoing, in the second embodiment, the first object 608 to be measured, which is present on the surface of the film of the first substrate 602, and the second object 610 to be measured, which is present in the film, can be individually analyzed in a short period of time compared to the first embodiment.

In the case of the configuration in which the inductively coupled plasma mass spectrometry instrument or the atomic absorption spectrometry instrument is provided, after Step S802 and Step S810, the liquid containing the first object 608 to be measured and the liquid containing the second object 610 to be measured are individually transferred to containers (not shown), and are introduced into the inductively coupled plasma mass spectrometry instrument or the atomic absorption spectrometry instrument. With this, the first object 608 to be measured and the second object 610 to be measured, which is present in the film, can be individually analyzed.

Third Embodiment

Figure 12:
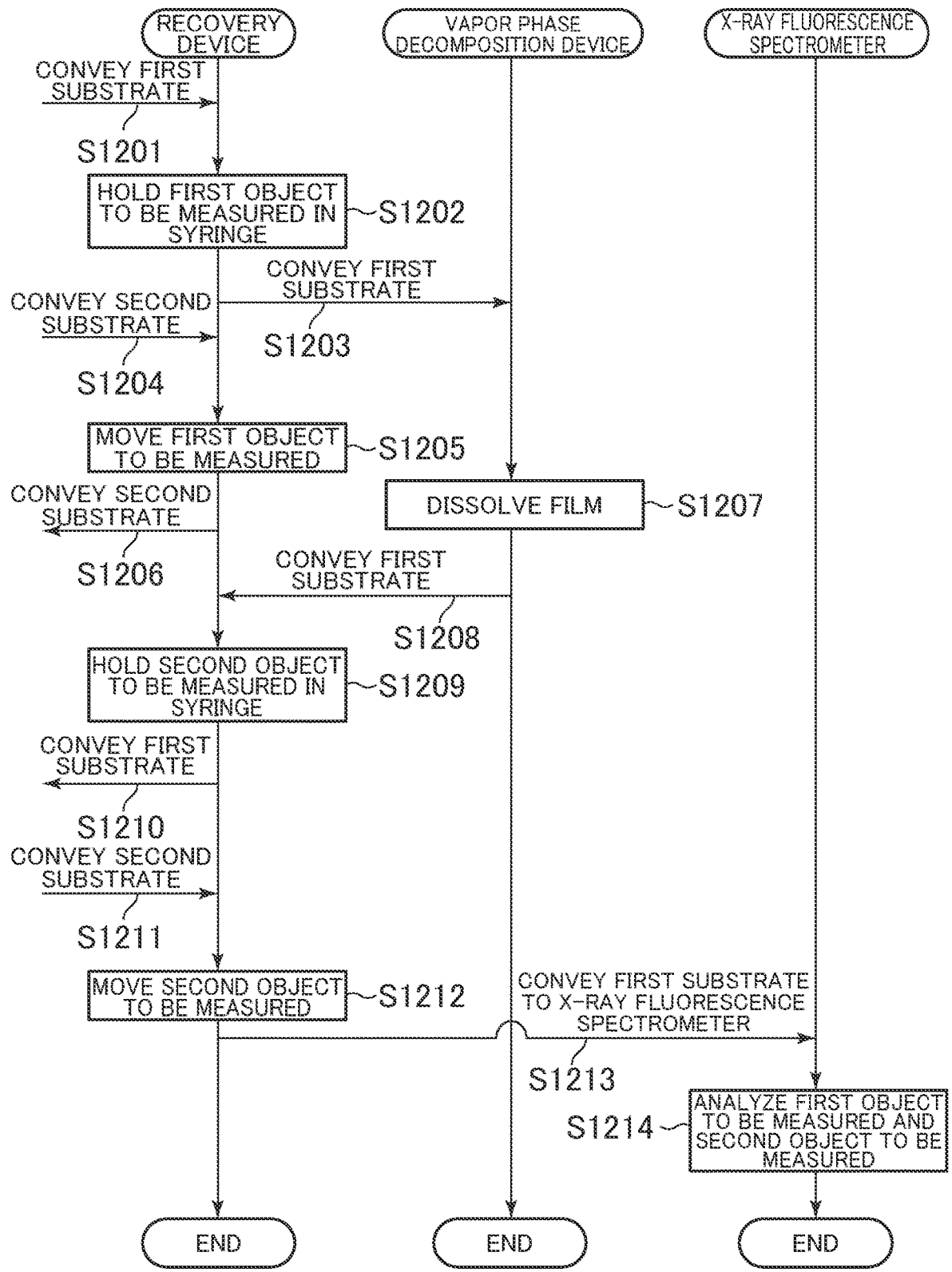
FIG. 12 is a diagram for illustrating a processing flow in a third embodiment.

Next, a third embodiment will be described. FIG. 12 is a flowchart for illustrating processing performed by the substrate contamination analysis system 100 according to the third embodiment. Step S1201 to Step S1205 are the same as Step S801 to Step S805, and hence description thereof is omitted. The operation performed by the recovery device 106 in Step S1202 to Step S1205 corresponds to the first recovery operation. After that, the conveying device 102 conveys the second substrate 604 to the preparation chamber (Step S1206).

The vapor phase decomposition device 104 dissolves the film under a state in which the first object 608 to be measured has been removed from the surface of the film (Step S1207). Step S1207 is the same as Step S808 in the second embodiment. After the film is dissolved, the conveying device 102 conveys the first substrate 602 to the recovery device 106 (Step S1208).

The recovery device 106 holds the second object 610 to be measured in the droplet holding portion 410 (Step S1209). Specifically, in the same manner as in Step S802 in the second embodiment, the liquid droplet containing a hydrofluoric acid solution, having taken in the second object 610 to be measured, is sucked up into the droplet holding portion 410. With this, the liquid droplet is held in the droplet holding portion 410.

Next, the conveying device 102 conveys the first substrate 602 to the preparation chamber (Step S1210). In addition, the conveying device 102 conveys the second substrate 604 to the recovery device 106 (Step S1211).

The recovery device 106 moves the second object 610 to be measured to the second measurement position on the surface of the second substrate 604 after the film is dissolved (Step S1212). Specifically, the recovery device 106 drops the liquid droplet held by the droplet holding portion 410 onto the second measurement position on the surface of the second substrate 604. After that, the drying portion 312 dries the liquid droplet, with the result that the second object 610 to be measured is left at the second measurement position on the second substrate 604. The operation performed by the recovery device 106 in Step S1209 to Step S1212 corresponds to the second recovery operation.

After that, the conveying device 102 conveys the second substrate 604 to the X-ray fluorescence spectrometer 108 (Step S1213).

Figure 13:
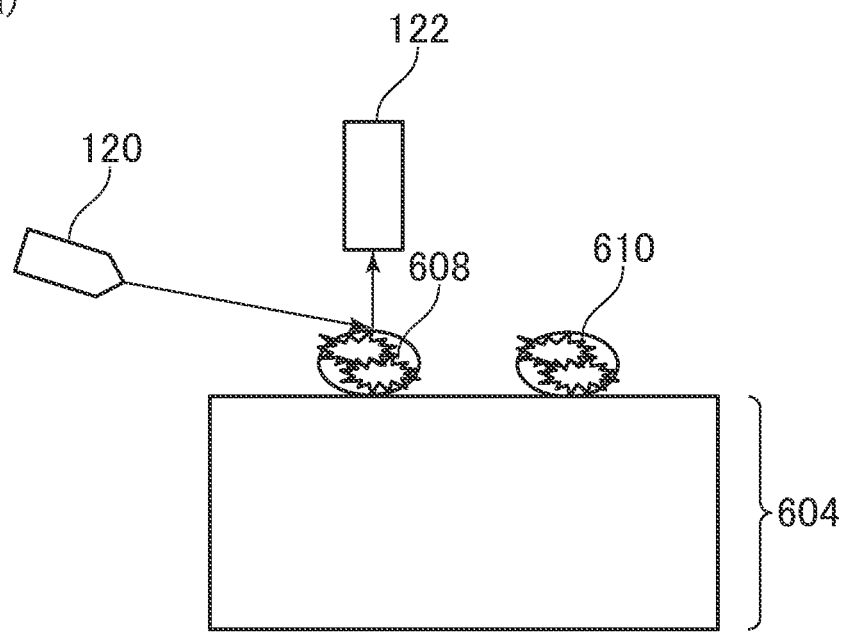
FIG. 13 are each a view for illustrating a processing step in the third embodiment.
Figure 13:
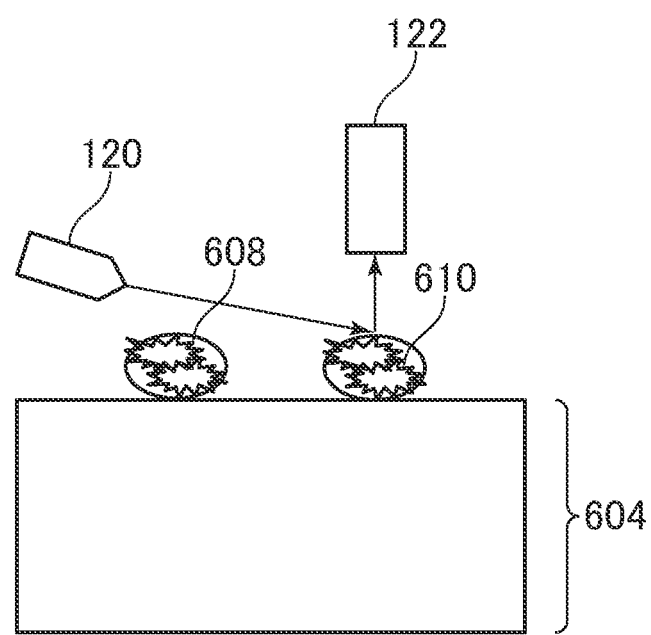

The X-ray fluorescence spectrometer 108 individually irradiates the first object 608 to be measured and the second object 610 to be measured, which have been moved to the surface of the second substrate 604, with the primary X-rays, to thereby individually analyze the first object 608 to be measured and the second object 610 to be measured (Step S1214). Specifically, as illustrated in FIG. 13(a), the X-ray fluorescence spectrometer 108 irradiates the first measurement position of the second substrate 604 with the primary X-rays. Only the first object 608 to be measured is present at the first measurement position, and hence the X-ray fluorescence spectrometer 108 acquires an analysis result of the first object 608 to be measured. In addition, as illustrated in FIG. 13(b), the X-ray fluorescence spectrometer 108 irradiates the second measurement position of the second substrate 604 with the primary X-rays. Only the second object 610 to be measured is present at the second measurement position, and hence the X-ray fluorescence spectrometer 108 acquires an analysis result of the second object 610 to be measured.

With the foregoing, in the third embodiment, similarly to the first and second embodiments, the first object 608 to be measured, which is present on the surface of the film of the first substrate 602, and the second object 610 to be measured, which is present in the film, can be individually analyzed. In the third embodiment, a drying mark does not remain on the surface of the first substrate 602, and hence the first substrate 602 can be reused without any processing.

In the case of the configuration in which the inductively coupled plasma mass spectrometry instrument or the atomic absorption spectrometry instrument is provided, after Step S1202 and Step S1209, the liquid containing the first object 608 to be measured and the liquid containing the second object 610 to be measured are individually transferred to containers (not shown), and are introduced into the inductively coupled plasma mass spectrometry instrument or the atomic absorption spectrometry instrument. With this, the first object 608 to be measured and the second object 610 to be measured, which is present in the film, can be individually analyzed.

The present invention is not limited to the above-mentioned examples and can be variously modified. The configuration of the X-ray fluorescence spectrometer 108 or the like is merely one example, and the present invention is not limited thereto. The configurations illustrated in the above-mentioned examples may be replaced by those having substantially the same configurations, those exhibiting the same action and effect, or those achieving the same object.

REFERENCE SIGNS LIST 100 substrate contamination analysis system, 102 conveying device, 104 vapor phase decomposition device, 106 recovery device, 108 X-ray fluorescence spectrometer, 110 pedestal, 112 rail, 114 hand, 116 extendable/contractible portion, 118 sample stage, 120 X-ray source, 122 detector, 124 counter, 126 analysis portion, 202 vapor phase decomposition chamber, 204 shutter, 206 substrate placement table, 208 introduction pipe, 210 discharge pipe, 302 recovery chamber, 304 storage chamber, 306 shutter, 308 rotating table, 310 recovery portion, 312 drying portion, 314 pipe, 316 liquid container, 320 control valve, 322 pump, 324 recovery arm, 326 nozzle, 402 housing, 404 drop port, 406 suction port, 408 jet port, 410 droplet holding portion, 602 first substrate, 604 second substrate, 606 film, 608 first object to be measured, 610 second object to be measured

The invention claimed is:

1. A substrate contamination analysis system, comprising:
   a vapor phase decomposition device configured to expose a film formed on a surface of a first substrate to a gas that reacts with the film, to thereby dissolve the film;
   a recovery device configured to perform a first recovery operation of moving a first object to be measured, which adheres to the surface of the film, to a first measurement position without the film being dissolved and a second recovery operation of moving a second object to be measured, which is present in the film, to a second measurement position after the film is dissolved; and
   an analyzer configured to analyze the first object to be measured or the second object to be measured every time the recovery device performs the first recovery operation and the second recovery operation.

2. The substrate contamination analysis system according to claim 1,
   wherein the analyzer comprises a total reflection X-ray fluorescence spectrometer configured to irradiate the first substrate with primary X-rays at an incident angle of less than a total reflection angle, to thereby analyze the first object to be measured or the second object to be measured based on output florescent X-rays,
   wherein the recovery device is configured to perform the first recovery operation of moving the first object to be measured to the first measurement position on the film,
   wherein the total reflection X-ray fluorescence spectrometer is configured to irradiate the first object to be measured with the primary X-rays, to thereby analyze the first object to be measured,
   wherein the vapor phase decomposition device is configured to dissolve the film under a state in which the first object to be measured is present on the surface of the film,
   wherein the recovery device is configured to perform, after the film is dissolved, the second recovery operation of moving the second object to be measured as well as the first object to be measured to the second measurement position on the surface of the first substrate, and
   wherein the total reflection X-ray fluorescence spectrometer is configured to irradiate the second object to be measured as well as the first object to be measured with the primary X-rays, to thereby analyze the first object to be measured and the second object to be measured together, and subtract, from a result of the analysis, an analysis result of the first object to be measured, to thereby calculate an analysis result of the second object to be measured.

3. The substrate contamination analysis system according to claim 1, wherein the first measurement position and the second measurement position are the same position on the first substrate.

4. The substrate contamination analysis system according to claim 1,
   wherein the recovery device is configured to perform the first recovery operation of moving the first object to be measured to the first measurement position on a surface of a second substrate different from the first substrate, wherein the vapor phase decomposition device is configured to dissolve the film under a state in which the first object to be measured has been removed from the surface of the film, wherein the recovery device is configured to perform, after the film is dissolved, the second recovery operation of moving the second object to be measured to the second measurement position on the surface of the first substrate, and wherein the total reflection X-ray fluorescence spectrometer is configured to analyze the first object to be measured while the recovery device performs the second recovery operation, and analyze the second object to be measured after the recovery device performs the second recovery operation.

5. The substrate contamination analysis system according to claim 1, wherein the recovery device is configured to perform the first recovery operation of moving the first object to be measured to the first measurement position on a surface of a second substrate different from the first substrate, wherein the vapor phase decomposition device is configured to dissolve the film under a state in which the first object to be measured has been removed from the surface of the film, wherein the recovery device is configured to perform, after the film is dissolved, the second recovery operation of moving the second object to be measured to the second measurement position on the surface of the second substrate, and wherein the total reflection X-ray fluorescence spectrometer is configured to individually irradiate the first object to be measured and the second object to be measured, which have been moved to the surface of the second substrate, with primary X-rays, to thereby individually analyze the first object to be measured and the second object to be measured.

6. The substrate contamination analysis system according to claim 1, wherein the recovery device includes a nozzle including a drop port configured to drop a liquid droplet configured to take in the first object to be measured or the second object to be measured and a jet port configured to spray a gas to a periphery of the dropped liquid droplet.

7. The substrate contamination analysis system according to claim 6, wherein the recovery device further includes a droplet holding portion configured to hold the liquid droplet when moving the liquid droplet having recovered the first object to be measured or the second object to be measured.

8. The substrate contamination analysis system according to claim 6, wherein the liquid droplet dropped by the recovery device in the first recovery operation comprises a solution containing nitric acid, and wherein the liquid droplet dropped by the recovery device in the second recovery operation comprises a solution containing hydrofluoric acid.

9. The substrate contamination analysis system according to claim 1, wherein the analyzer comprises an inductively coupled plasma mass spectrometry instrument or an atomic absorption spectrometry instrument.

* * * * *